(12) United States Patent
Abe

(10) Patent No.: US 8,158,503 B2
(45) Date of Patent: Apr. 17, 2012

(54) MULTILAYER INTERCONNECTION SUBSTRATE AND METHOD OF MANUFACTURING THE SAME

(75) Inventor: Tomoyuki Abe, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 459 days.

(21) Appl. No.: 11/474,453

(22) Filed: Jun. 26, 2006

(65) Prior Publication Data

US 2007/0232059 A1   Oct. 4, 2007

(30) Foreign Application Priority Data

Mar. 28, 2006   (JP) ................................ 2006-087431

(51) Int. Cl.
    *H01L 21/44* (2006.01)
(52) U.S. Cl. ................ 438/597; 257/E21.011; 257/774
(58) Field of Classification Search .................. 257/774, 257/E21.011, E21.135, E21.154, E21.156; 438/597, 598, 618
    See application file for complete search history.

(56) References Cited

U.S. PATENT DOCUMENTS

| 6,130,476 | A * | 10/2000 | LaFontaine et al. | 257/678 |
| 6,641,898 | B2 | 11/2003 | Yazaki et al. | 428/209 |
| 2001/0004944 | A1 * | 6/2001 | Nakamura et al. | 174/262 |
| 2002/0066961 | A1 * | 6/2002 | Tomekawa et al. | 257/776 |
| 2003/0102153 | A1 * | 6/2003 | Sugaya et al. | 174/256 |
| 2005/0011677 | A1 * | 1/2005 | Yoshino et al. | 174/263 |

FOREIGN PATENT DOCUMENTS

| JP | 3-87090 | 4/1991 |
| JP | 11-186680 | 7/1999 |
| JP | 11-214575 | 8/1999 |
| JP | 11-251751 | 9/1999 |
| JP | 2000-223836 | 8/2000 |
| JP | 2003-110243 | 4/2003 |

OTHER PUBLICATIONS

Office Action dated Apr. 26, 2011 issued by a Japanese patent application No. 2006-087431 with English translation.

* cited by examiner

*Primary Examiner* — Alexander Ghyka
*Assistant Examiner* — Leonard Chang
(74) *Attorney, Agent, or Firm* — Kratz, Quintos & Hanson, LLP

(57) ABSTRACT

A multilayer interconnection substrate is disclosed that includes a multilayer interconnection layer having at least a first interconnection layer and a second interconnection layer stacked with an insulating layer provided therebetween, and a connection via configured to electrically connect the first interconnection layer and the second interconnection layer. The connection via includes an internal conductor and a metal film covering the internal conductor. The internal conductor is an aggregate of metal particles.

7 Claims, 9 Drawing Sheets

FIG.7

| | JP11-186680 | PRESENT INVENTION |
|---|---|---|
| IN-VIA METAL CONTENT (vol%) | 60 | 100 |
| APPARENT RESISTIVITY ($\Omega \cdot cm$) | 6.1 | 3 |

MULTILAYER INTERCONNECTION SUBSTRATE AND METHOD OF MANUFACTURING THE SAME

CROSS-REFERENCE TO RELATED APPLICATION

The present application is based on Japanese Priority Patent Application No. 2006-087431, filed on Mar. 28, 2006, the entire contents of which are hereby incorporated by reference.

BACKGROUND OF THE INVENTION

1. Field of the Invention

The present invention relates generally to multilayer interconnection substrates and methods of manufacturing the same, and more particularly to a multilayer interconnection substrate in which interconnection patterns formed in different layers are connected by an interstitial via hole, and a method of manufacturing the same.

2. Description of the Related Art

In these years, LSIs are becoming finer, faster, and higher in frequency. Materials and structures suitable for high-speed transmission as well as higher density are also required for package substrates for packaging LSIs. Conventionally, a printed board in which build-up multilayer interconnections are formed is used as a package substrate for high-density packaging. However, in order to further increase interconnection density, it is necessary to increase the number of interconnection layers. Currently, build-up boards are manufactured by forming layer on layer in a sequential process, which is lengthy and results in an increase in costs. Therefore, a manufacturing method that shortens the process by forming the interconnections of the layers in parallel and thereafter stacking the layers simultaneously shows promise.

In substrates manufactured by such simultaneous layer stacking, it is necessary to form an interstitial via hole (IVH) that connects only specific layers. In a multilayer IVH substrate, the continuity between layers is established at the time of simultaneously stacking layers. Conventionally known methods of establishing continuity between stacked substrates include filling in with conductive paste that hardens an adhesive agent, diffusion bonding using low-melting metal, and performing solder plating on metal core balls and filling in with the balls.

Further, as methods of connecting conductors in a via or layers, there are proposed methods that achieve connection of metal particles in a via and interlayer connection with a land by sintering the metal particles by applying pulse current (see, for example, Japanese Laid-Open Patent Applications No. 11-186680, No. 2000-223836, and 11-251751). Further, a method that forms through holes and thereafter fills the through holes in the middle with metal balls equal in diameter to the through holes is also known (see, for example, Japanese Laid-Open Patent Application No. 3-87090).

Of the above-described conventional methods, the type of method that fills in with conductive paste that hardens an adhesive agent is lacking in connection reliability because the layers of a multilayer IVH substrate that are simultaneously stacked are connected only by bonding.

According to the method of performing diffusion bonding using low-melting metal, the temperature of heat treatment of a substrate, which is a temperature for stacking prepreg, is approximately 200° C. in most cases. Therefore, a low-melting metal having a melting point of approximately 200° C. is employed to fill in vias. However, the metal remelts at a temperature of 260° C. at which a lead-free solder material applied at the time of chip packaging is reflowed, thus causing problems such as corrosion of copper lands and breakage due to warping of a substrate.

According to the method of plating metal core balls with solder and filling via holes with the balls, it is difficult to control the thickness of plating on the surface of the balls. In particular, if the ball diameter is small, the thickness of plating is uncontrollable so that plating becomes thick. In this case, the solder remelts at the time of a heating process after joining, thus lacking in joining reliability. Further, since the via holes are filled with the balls, the via holes should be at least several times greater in diameter than the balls, thus making it difficult to make fine via holes.

According to the methods that achieve connection of metal particles in a via and interlayer connection with a land by sintering the metal particles by applying pulse current (Japanese Laid-Open Patent Applications No. 11-186680, No. 2000-223836, and 11-251751), the contacting portions of the particles merely neck (come into point contact), thus increasing conductor resistance. Further, pulse current is applied to a via through an interconnection line. Therefore, if the interconnection line is finer than the via, the interconnection line generates heat with Joule heat due to the current application, so that a desired current may not be applied to the via. Further, the interconnection line may be burned out. Thus, there are limitations on formation of interconnection lines.

According to the method that forms through holes and thereafter fills the through holes in the middle with metal balls equal in diameter to the through holes (Japanese Laid-Open Patent Application No. 3-87090), metal balls having the same diameter as the through holes are selected to fill in the through holes, which requires money and effort. Therefore, this method is not considered to be industrial.

SUMMARY OF THE INVENTION

Embodiments of the present invention may solve or reduce one or more of the above-described problems.

In a preferred embodiment of the present invention, there are provided a multilayer interconnection substrate in which the above-described problems are solved, and a method of manufacturing the same.

In a preferred embodiment of the present invention, there are provided a multilayer interconnection substrate such as a multilayer IVH substrate that can achieve low resistance joining by ensuring a sufficient contact area and improve connection reliability by eliminating remelting even in heat treatment after simultaneous stacking of layers, and a method of manufacturing the same.

In a preferred embodiment of the present invention, a via hole for connecting interconnection layers is filled with metal particles of good conductivity (such as Cu) having a Au or Ag film formed on the surfaces thereof, and the metal particles are brought into contact with a film of low-melting metal (such as Sn) formed on a land at the time of stacking the interconnection layers so as to cause the low-melting metal to diffuse onto the surfaces of the metal particles, thereby connecting the interconnection layers. As the low-melting metal, Sn—Bi—Ag-based solder and the like may be employed.

According to one aspect of the present invention, there is provided a multilayer interconnection substrate including a multilayer interconnection layer having at least a first interconnection layer and a second interconnection layer stacked with an insulating layer provided therebetween; and a connection via configured to electrically connect the first interconnection layer and the second interconnection layer, wherein the connection via includes an internal conductor and a metal film covering the internal conductor, the internal conductor being an aggregate of metal particles.

According to another aspect of the present invention, there is provided a method of manufacturing a multilayer interconnection substrate including the steps of (a) forming an interconnection pattern on a first insulating layer; (b) forming a film of low-melting metal on a land part of the interconnection pattern, the land part being to be connected to a via; (c) forming a via hole in a second insulating layer and filling the via hole with metal particles; and (d) connecting the interconnection pattern to the via hole by causing the low-melting metal to diffuse onto surfaces of the metal particles in the via hole by bringing the film of the low-melting metal and the metal particles in the via hole into contact with each other by superposing the first insulating layer and the second insulating layer.

According to the above-described configuration and method, there are no restrictions on lines and space width. Further, since the particles in a via are joined through diffusion of low-melting metal, the particles are in point contact with one another, so that low-resistance joining can be achieved.

Further, since the low-melting metal diffuses onto the surfaces of the metal particles in the via so as to enter the spaces among the metal particles, the anchor effect is produced, so that connection reliability can be improved.

BRIEF DESCRIPTION OF THE DRAWINGS

Other objects, features and advantages of the present invention will become more apparent from the following detailed description when read in conjunction with the accompanying drawings, in which:

FIG. 7 is a table for illustrating effects according to the present invention.

DETAILED DESCRIPTION OF THE PREFERRED EMBODIMENTS

A description is given below, with reference to the accompanying drawings, of embodiments of the present invention.

Figure 1:
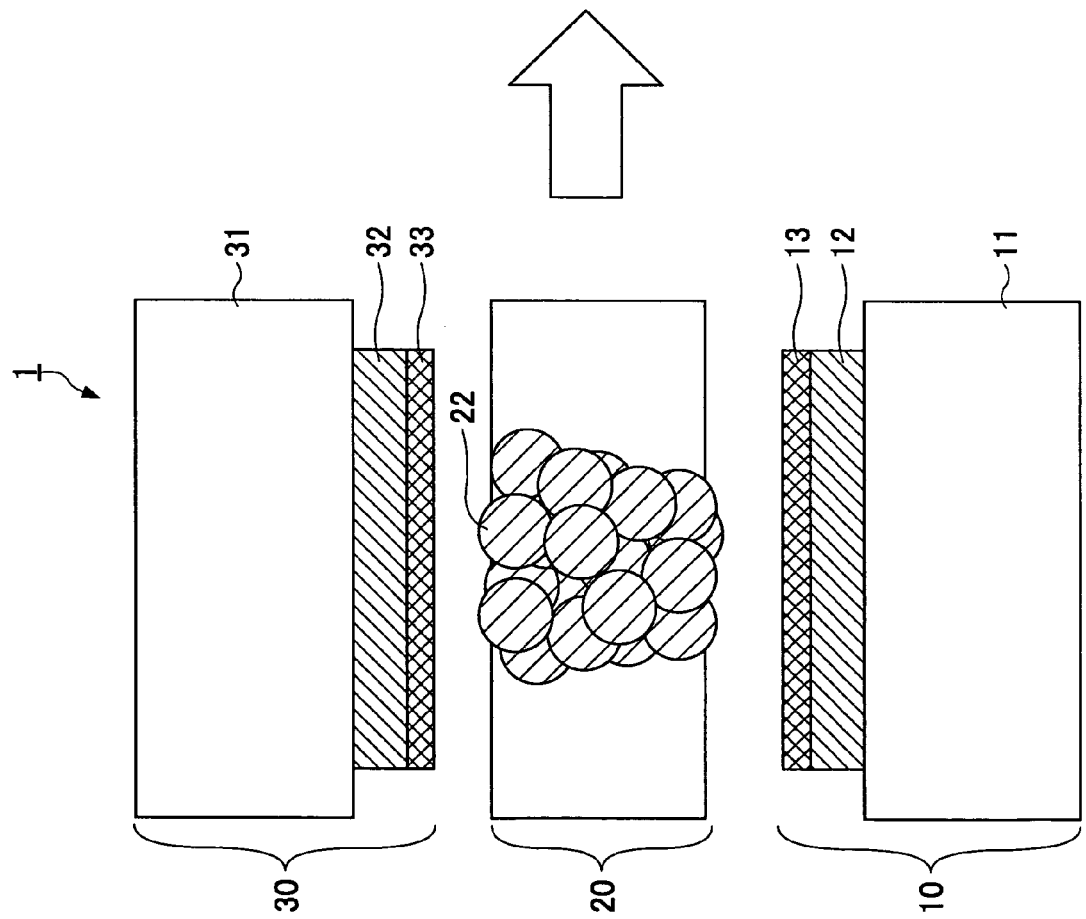
FIG. 1 is a schematic diagram for illustrating a basic configuration according to the present invention.

FIG. 1 is a schematic diagram for illustrating a basic configuration according to the present invention. A multilayer interconnection substrate 1 has a first multilayer interconnection layer 10 and a second multilayer interconnection layer 30 connected by a connecting layer 20, for example. Via holes (not graphically illustrated) are formed in the connecting layer 20 by a laser. The via holes are filled with metal particles 22 of good conductivity on which surfaces a gold (Au) or silver (Ag) film is formed. In the case of FIG. 1, there are employed copper (Cu) particles coated with gold (Au), which are also referred to as "Au-coated Cu balls 22" for convenience of description. The Au-coated Cu balls 22 are 5 μm to 15 μm in diameter, and their average particle size is approximately 10 μm.

On the other hand, the first multilayer interconnection layer 10 and the second multilayer interconnection layer 30 have interconnection patterns 12 and 32 formed on insulating resin layers 11 and 31, respectively. The parts of the interconnection patterns 12 and 32 to be connected to vias serve as lands, which are also referred to by the same numerals 12 and 32 for convenience of description. Low-melting metal films 13 and 33, whose material is represented by tin (Sn), are formed on the surfaces of the lands 12 and 32, respectively. The low-melting metal films 13 and 33 are, for example, Sn—Bi—Ag-based solder films.

Referring to FIG. 1, at the time of stacking the layers 10 and 30, the metal particles (Au-coated Cu balls) 22 with which a via hole is filled and the Sn-based low-melting metal films 13 and 33 are brought into contact with each other and heated at low temperature. As a result, the low-melting metal of the low-melting metal films 13 and 33 is diffused onto the surfaces of the metal particles 22, thereby establishing electrical interlayer connection. That is, as shown on the right side of FIG. 1, the land 13 of the first multilayer interconnection layer 10 and the land 33 of the second multilayer interconnection layer 30 are connected by a joining via 25. The inside of the joining via 25 is metal particles of good conductivity such as Cu, and the surface thereof is a joining film formed by diffusion of Au forming the surface coating of the metal particles 22 into the low-melting metal such as Sn. Further, part of the surfaces of the Cu particles forms an alloy with the low-melting metal such as Sn (Cu—Sn).

According to this configuration, there is no necessity for application of pulse current. Accordingly, there are no restrictions on lines and space width. Further, the metal particles in the via are joined through the low-melting metal that diffuses onto the surfaces of the metal particles. As a result, the metal particles come into surface contact with one another, so that the joining can be achieved with low resistance.

Further, the low-melting metal films 13 and 33 that establish electrical interlayer connection are equal in area to the lands 12 and 32, respectively, so that a large connection interface is provided between the joining via 25 and each of the lands 12 and 32. Further, the anchor effect is produced. That is, the metal particles filling in the via hole form unevenness, and the low-melting metal of the low-melting metal films 13 and 33 formed on the lands 12 and 32 enters the concavities of the unevenness, thereby increasing adhesion. As a result, connection reliability can be improved.

First Embodiment

Figure 2A:
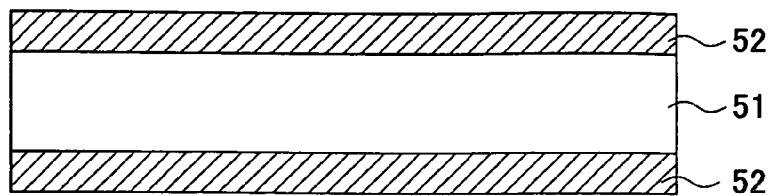
FIGS. 2A through 2H are diagrams showing a process of making a double-sided multilayer interconnection layer according to a first embodiment of the present invention.
Figure 2B:
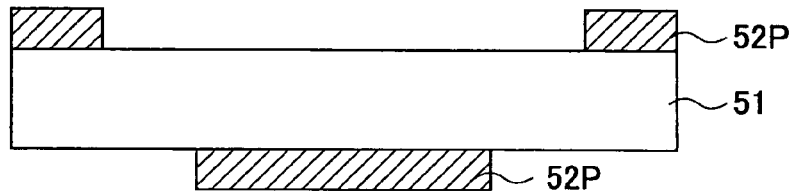
Figure 2C:
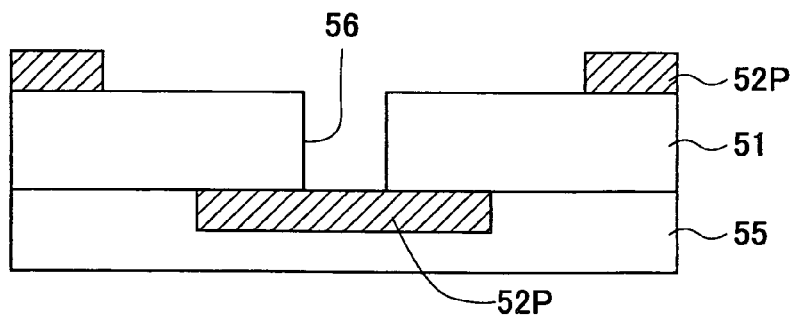
Figure 2D:
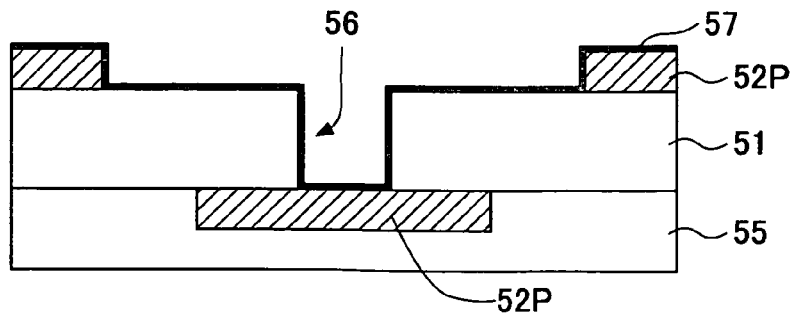
Figure 2E:
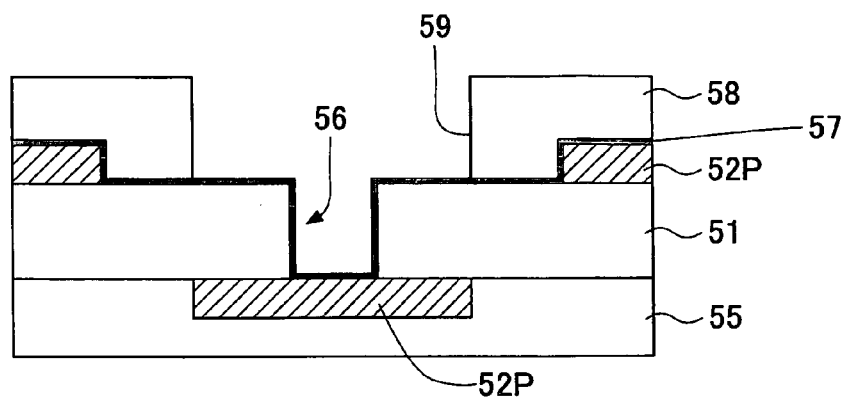
Figure 2F:
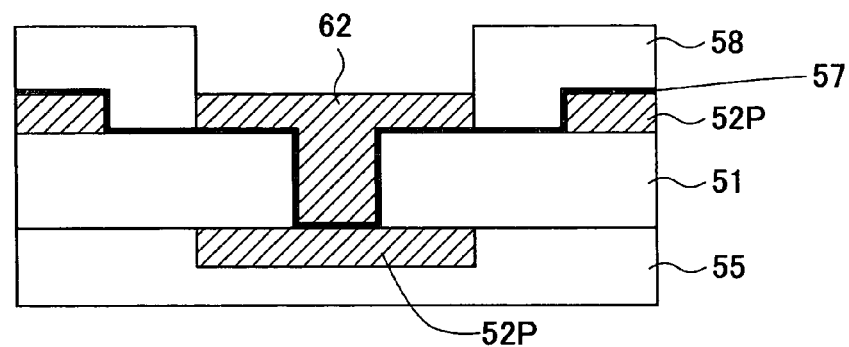
Figure 2G:
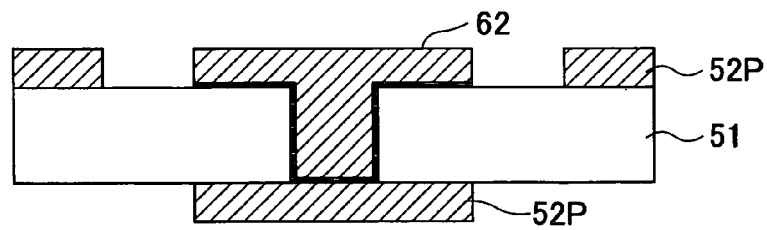
Figure 2H:
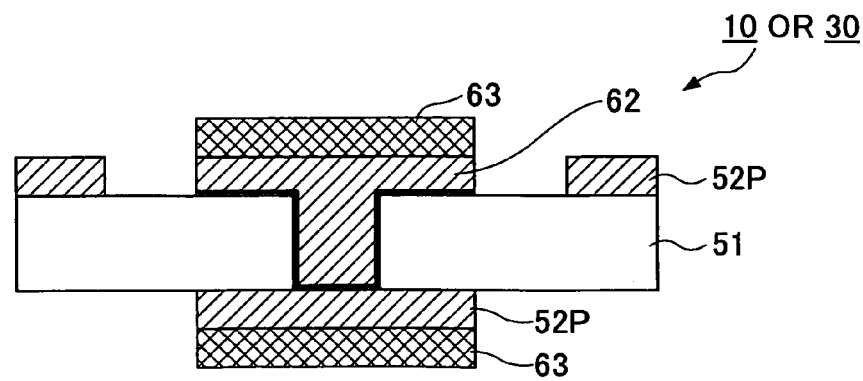
Figure 3A:
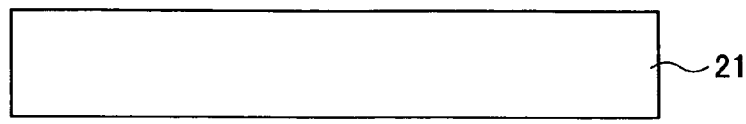
FIGS. 3A through 3E are diagrams showing a process of making a joining layer according to the first embodiment of the present invention.
Figure 3B:
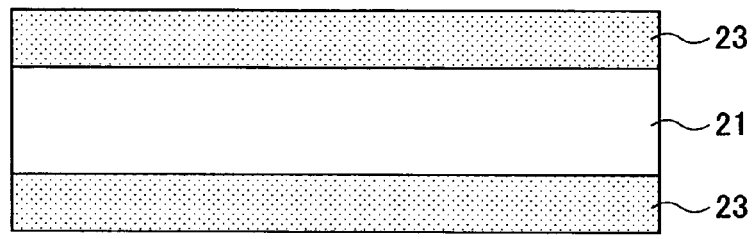
Figure 3C:
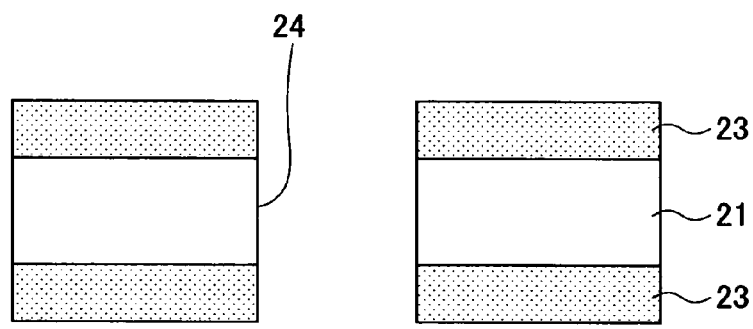
Figure 3D:
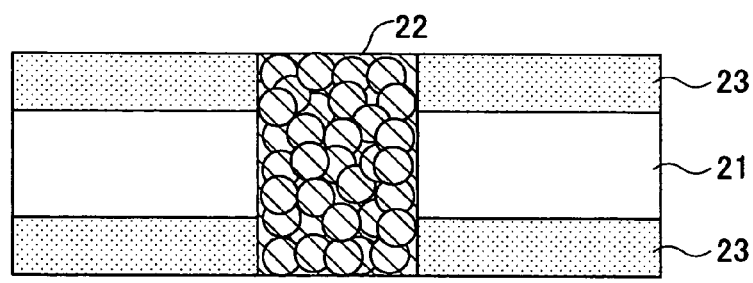
Figure 3E:
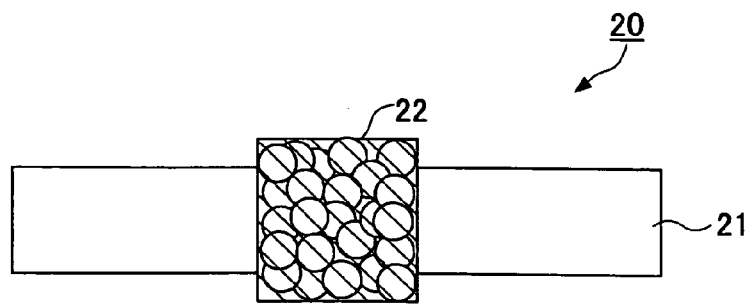
Figure 4A:
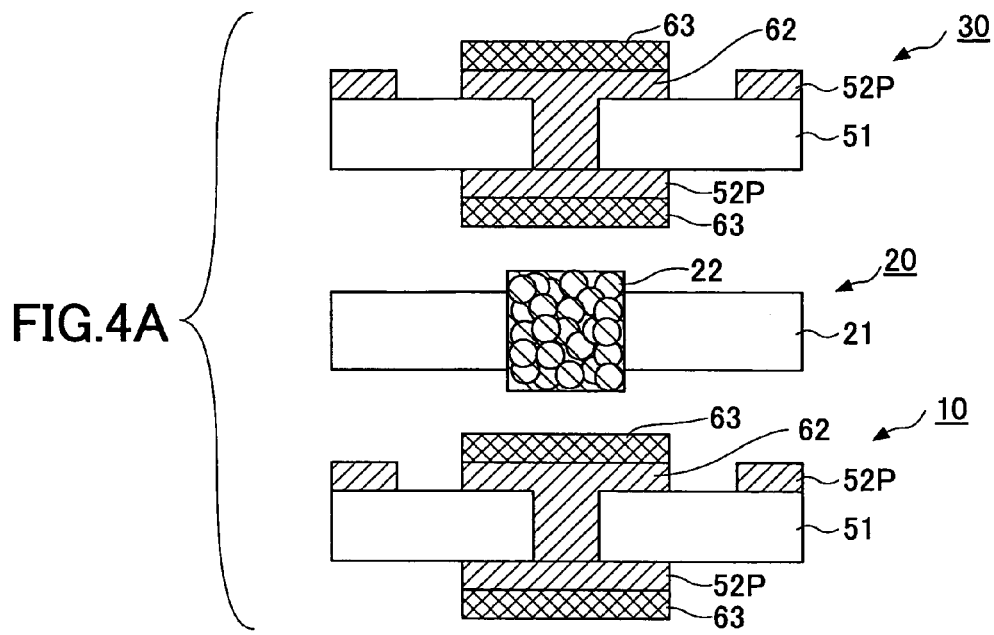
FIGS. 4A through 4C are diagrams showing a stacking and integration process according to the first embodiment of the present invention.
Figure 4B:
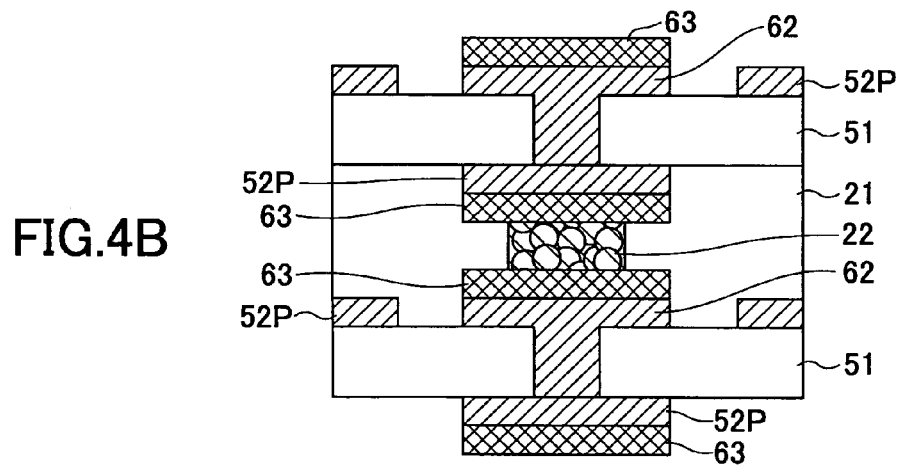
Figure 4C:
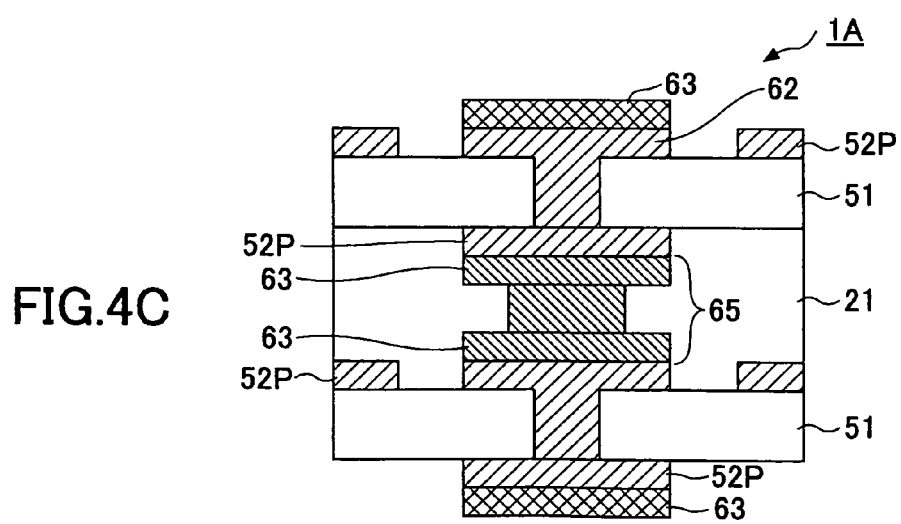

A description is given, with reference to FIGS. 2A through 4C, of a first embodiment of the present invention employing the method of FIG. 1. In the first embodiment, double-sided multilayer interconnection layers are joined by IVH. FIGS. 2A through 2H show a process of making the double-sided multilayer interconnection layer 10 or 30. FIGS. 3A through 3E show a process of making the joining layer 20. FIGS. 4A through 4C show a process of joining the double-sided multilayer interconnection layers 10 and 30 and the joining layer 20.

First, as shown in FIG. 2A, electrolytic copper foil 52 of 18 μm in thickness is adhered by vacuum pressing (200° C., 3

MPa) to each side of a prepreg 51 of 340×510 mm in size and 60 μm in thickness, thereby making a double-sided coppered sheet.

Next, as shown in FIG. 2B, an interconnection pattern 52p of L/S=50/50 μm is formed on each side by a so-called subtractive process. Specifically, a dry film resist (DFR) is laminated on the copper foil 52 on each side, and is patterned by exposure and development, thereby forming an etching mask (not graphically illustrated). After performing wet etching on the copper foil 52 using etchant including iron chloride, the DFRs are removed, so that the interconnection patterns 52p are formed.

Next, as shown in FIG. 2C, after forming a protection layer 55 by laminating a DFR on the bottom surface, a via hole 56 of 100 μm in diameter to serve as a blind via is formed at a predetermined position in the prepreg 51 from the top side using a carbon dioxide gas laser.

Next, as shown in FIG. 2D, electroless copper plating is performed after desmearing, so that a seed layer 57 is formed on the top surface.

Next, as shown in FIG. 2E, a DFR 58 is laminated on the seed layer 57, and is patterned so that an opening 59 to expose the via hole 56 is formed.

Next, as shown in FIG. 2F, a filling via 62 is formed in the via hole 56 by copper electroplating.

Next, as shown in FIG. 2G, the DFR 58 on the top side and the DFR 55 on the bottom side are removed and the plated seed layer 57 is etched, thereby completing the interconnection pattern 52p and the interconnection pattern (filling via) 62.

Finally, as shown in FIG. 2H, solder paste 63 whose principal component is Sn—Bi is printed on each of the land (interconnection pattern) 52p and the land (interconnection pattern) 62 for via connection by screen printing. Thereby, the layers of the land 62 or 52p and the solder paste 63 equivalent to two conductive layers are formed at a via connection part on each side. Alignment marks for joining are formed at positions not graphically illustrated on the double-sided multilayer interconnection layers 10 and 30 at the time of, for example, laser processing.

FIGS. 3A through 3E show a process of making the joining layer 20. First, as shown in FIG. 3A, a prepreg 21 of 60 μm in thickness is prepared. Then, as shown in FIG. 3B, a PET protection film 23 is adhered to each side of the prepreg 21.

Next, as shown in FIG. 3C, a through hole 24 of 100 μm in diameter is formed using a carbon dioxide gas laser.

Next, as shown in FIG. 3D, the through hole 24 is filled with the Au-coated Cu balls (particles) 22 by squeezing. Electroless Au plating of approximately 0.07 μm in film thickness is formed on the surfaces of the Cu particles, whose average particle size is approximately 10 μm.

Finally, as shown in FIG. 3E, the PET film 23 is removed from each side, so that the joining layer 20 is completed. Alignment marks for joining are also formed at positions not graphically illustrated on the joining layer 20 by laser processing.

FIGS. 4A through 4C show a process of stacking and integrating the double-sided multilayer interconnection layers 10 and 30 made in the processes of FIGS. 2A through 2H using the joining layer 20 made in the process of FIGS. 3A through 3E. First, as shown in FIG. 4A, alignment is performed with an apparatus for alignment and lamination for stacking ceramic sheets using the alignment marks (not graphically illustrated) formed on each sheet, that is, each of the double-sided multilayer interconnection layers 10 and 30 and the joining layer 20.

Next, as shown in FIG. 4B, temporary stacking is performed at 120° C. and 1 MPa. At this stage, any number of layers can be stacked. In this embodiment, 30 interconnection layers are stacked by repeating the alignment (only two layers are graphically shown in FIGS. 4A through 4C).

Thereafter, as shown in FIG. 4C, permanent stacking is performed at 200° C. and 3 MPa using a vacuum press, so that a multilayer interconnection substrate 1A is completed. This low-temperature vacuum pressing causes the Sn—Bi solder 63 formed on each of the lands 52p and 62 to diffuse onto the surfaces of the Au-coated Cu balls 22 so as to tightly join the Cu particles, so that a joining via 65 electrically connecting the lands 52p and 62 is formed. The inside of the joining via 65 is Cu particles, and the surface of the joining via 65 is a low-melting metal film formed by diffusion of Sn and Bi into Au.

Although not graphically illustrated, in the application to actual products, surface electrodes are formed on the surfaces of the multilayer interconnection substrate 1A by a known method, and the multilayer interconnection substrate 1A is cut into package-size portions. For example, surface electrodes may be formed by forming a solder resist film on each side of the multilayer interconnection substrate 1A, forming an opening in each part corresponding to an electrode in each solder resist film by a photolithography process, and forming Ni—P of 3 μm and Au of 0.1 μm in the openings by electroless plating. An LSI chip of 0.3 mm in thickness is soldered to a cut-out package substrate, the space between the chip and the substrate is sealed by insulating resin, and a stiffener and a heat sink are attached, so that a semiconductor package is completed.

Second Embodiment

A description is given, with reference to FIGS. 5A through 6C, of a second embodiment of the present invention. In the second embodiment, a multilayer interconnection substrate is manufactured by joining single-sided interconnection layers.

Figure 5A:
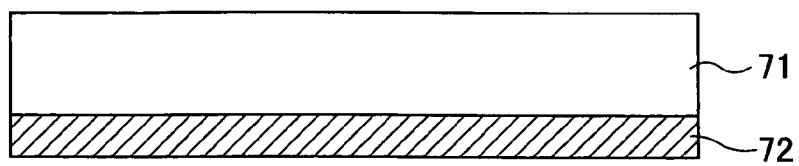
FIGS. 5A through 5G are diagrams showing a process of making a single-sided interconnection layer according to a second embodiment of the present invention.

First, as shown in FIG. 5A, electrolytic copper foil 72 of 18 μm in thickness is adhered by vacuum pressing to one side of a prepreg 71 of 340×510 mm in size and 0.08 mm in thickness, thereby making a single-sided coppered sheet.

Figure 5B:
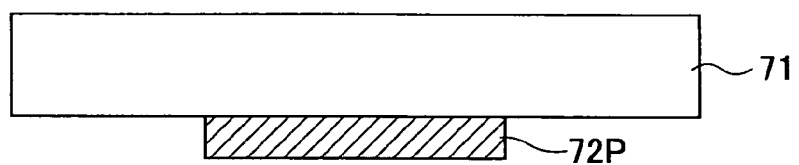

Next, as shown in FIG. 5B, an interconnection pattern 72p of L/S=50/50 μm is formed by a so-called subtractive process. That is, a dry film resist (DFR) (not graphically illustrated) is laminated on the copper foil 72, and is patterned by exposure and development. After performing wet etching on the copper foil 72, the DFR is removed, so that the interconnection pattern 72p is formed. This interconnection pattern 72p serves as a land for via connection.

Figure 5C:
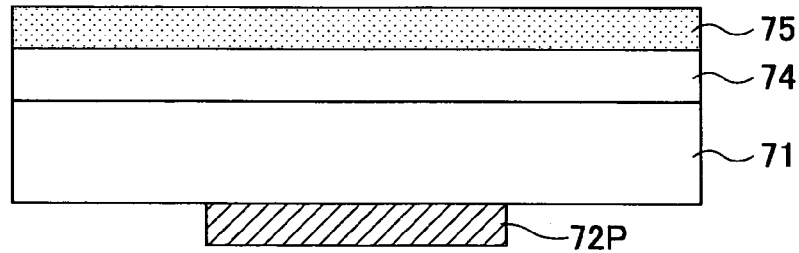

Next, as shown in FIG. 5C, a semi-cured (B-stage) epoxy resin sheet 74 of 30 μm in thickness is adhered to the opposite side of the above-described sheet from the pattern-formed surface using a vacuum laminator. A PET film 75 is further adhered to the surface of the epoxy resin sheet 74. This PET film 75 serves as a protection film in subsequent processes.

Figure 5D:
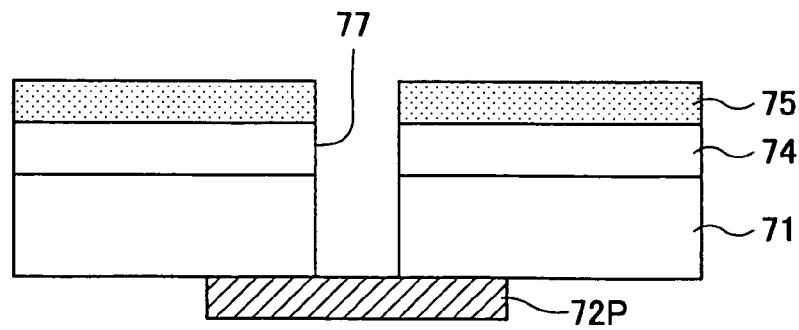

Next, as shown in FIG. 5D, a via hole 77 of 100 μm in diameter is formed from the PET film 75 side, using a carbon dioxide gas laser, so as to reach the land of the bottom-side interconnection pattern 72. At this point, although not graphically illustrated, alignment marks for joining may be formed.

Figure 5E:
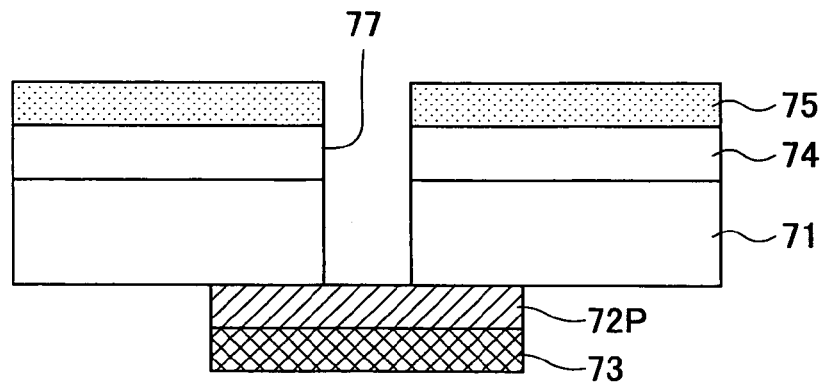

Next, as shown in FIG. 5E, solder paste 73 whose principal component is Sn—Bi is printed on the land of the interconnection pattern 72p by screen printing.

Figure 5F:
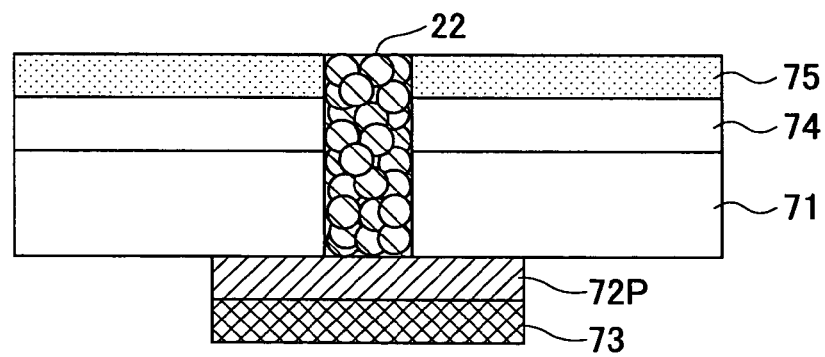

Next, as shown in FIG. 5F, the via hole 77 is filled with the Au-coated Cu balls (particles) 22 by squeezing. Electroless Au plating of approximately 0.07 μm in film thickness is formed on the surfaces of the Cu particles, whose average particle size is approximately 10 μm.

Figure 5G:
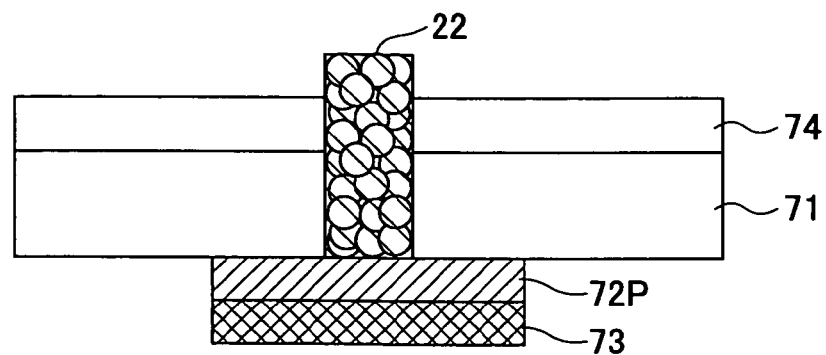

Next, as shown in FIG. 5G, the PET film 75 is removed, so that a single-sided interconnection sheet in which the interconnection pattern 72p has been formed and the via hole 77 has been filled with the Au-coated Cu balls (via material) 22 is made for each layer.

Figure 6A:
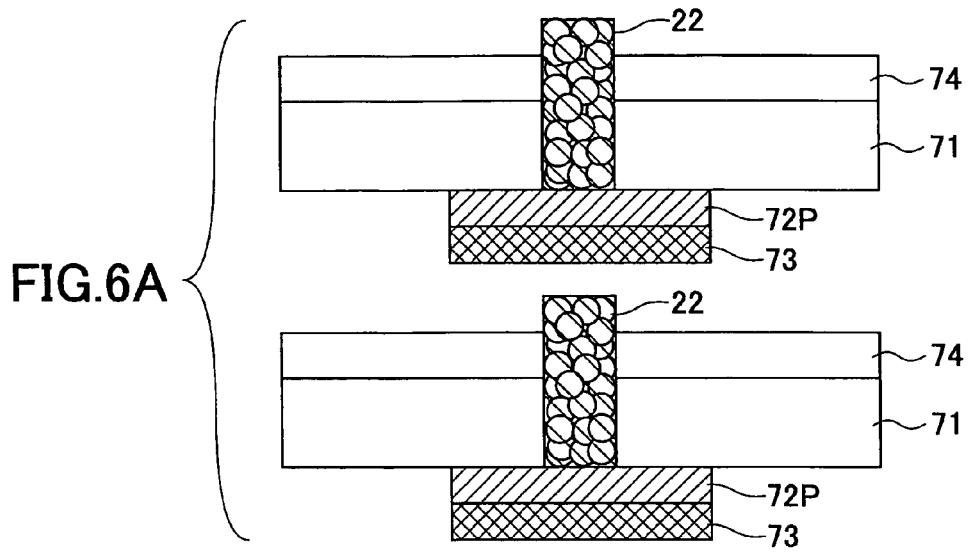
FIGS. 6A through 6C are diagrams showing a stacking and integration process according to the second embodiment of the present invention.
Figure 6B:
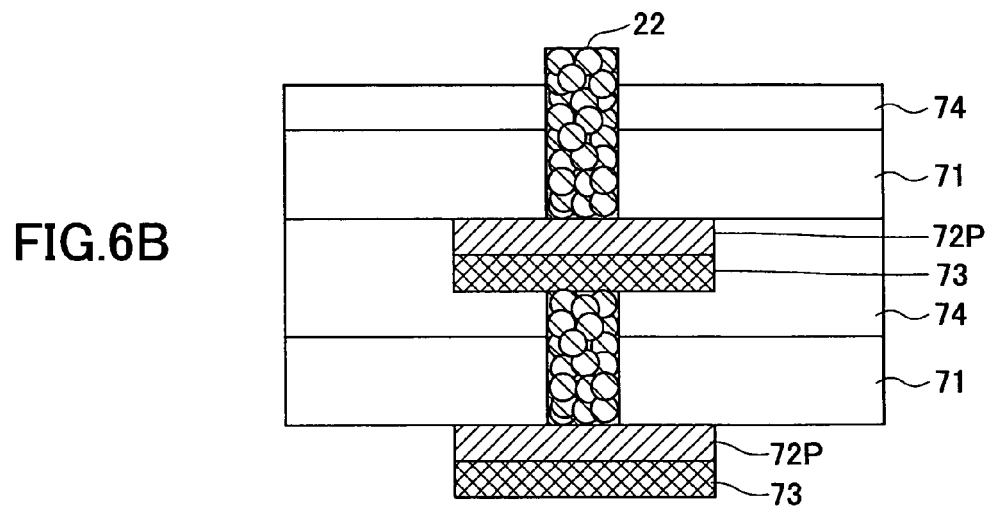
Figure 6C:
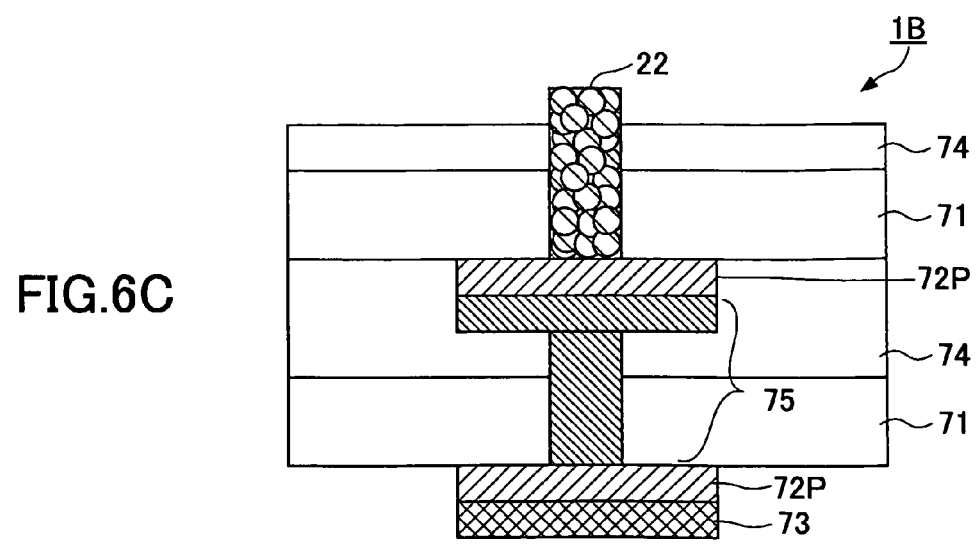

FIGS. 6A through 6C show a process of stacking and integrating the single-sided multilayer interconnection sheets formed in the process of FIGS. 5A through 5G. First, as shown in FIG. 6A, alignment is performed with an apparatus for alignment and lamination for stacking ceramic sheets using the alignment marks formed on each single-sided multilayer interconnection sheet.

Next, as shown in FIG. 6B, temporary stacking is performed at 120° C. and 1 MPa. Any number of layers can be stacked. Here, 30 layers are stacked by repeating the alignment.

Finally, as shown in FIG. 6C, permanent stacking is performed at 200° C. and 3 MPa using a vacuum press, so that a multilayer interconnection substrate 1B is completed. The low-temperature vacuum pressing causes the Sn—Bi solder 73 formed on the land 72p to diffuse into the surface Au film of the Au-coated Cu balls 22 so as to tightly join the Cu particles, so that a joining via 75 electrically connecting the lands 72p is formed. The inside of the joining via 75 is Cu particles, and the surface of the joining via 75 is a low-melting metal film formed by diffusion bonding of Sn and Bi to Au.

Although not graphically illustrated, in the application to actual products, surface electrodes are further formed by forming a solder resist film on each side of the multilayer interconnection substrate 1B, forming an opening in each part corresponding to an electrode by a photolithography process, and forming a Ni—P film of 3 μm and a Au film of 0.1 μm in the openings by electroless plating. This multilayer interconnection substrate 1B is cut into package-size portions to serve as package substrates. An LSI chip of 0.3 mm in thickness is soldered to a package substrate, the space between the chip and the substrate is sealed by insulating resin, and a stiffener and a heat sink are attached, so that a semiconductor package is completed.

FIG. 7 is a table for illustrating effects according to the present invention. The metal content (vol %) and the apparent resistivity (Ω·cm) inside a joining via formed by tightly joining Cu particles by causing low-melting metal to diffuse into the Au coat on the surfaces of the Cu particles according to a method of the present invention were measured. As a comparative example, the metal content and the apparent resistivity inside a joining via formed by sintering metal particles in a via hole by applying pulse current as in the conventional technique (aforementioned Japanese Laid-Open Patent Application No. 11-186680, hereinafter JP11-186680) were calculated.

According to JP11-186680, the in-via metal content is converted to 60 vol %. Further, according to JP11-186680, the metal particles are in point contact with each other in the via, and this contact area ratio is 0.1-0.9 of the particle size. Further, the ratio of the volume that the Cu particles can form as a matrix in the via is more than or equal to 50%. If sintering is allowed to progress beyond that, the metal particles disperse to be in point contact. This increases resistivity, so that the minimum resistivity is 6.1Ω·cm, which is 3.6 times as high as a theoretical value.

On the other hand, according to the first or second embodiment of the present invention, the final amount of metal paste with which the via is filled is 100 vol %, and the resistivity of the via conductor is 3Ω·cm, which is approximately half the resistivity according to JP11-186680. This shows that the via resistance is halved.

Further, according to JP11-186680, since the in-via conductor ratio is 60%, the via-land contact area is also no more than 60%. Therefore, the connection strength is only approximately 0.6 times as much as that according to the embodiments. On the other hand, according to the first and second embodiments, the via-land contact area is 100%, thus providing sufficient mechanical strength for a tensile stress in the directions of substrate thickness.

As described above, according to embodiments of the present invention, it is possible to form a low-resistance via whose conductor resistance is reduced to the half of that of the conventional via, and the connection strength against tensile stress in the directions of substrate thickness is 1.5 times or more as much as that of the conventional via. Accordingly, it is possible to obtain a multilayer interconnection substrate whose via connection reliability is remarkably improved both electrically and mechanically.

In the above-described embodiments, Sn—Bi is employed as the low-melting metal paste. However, the low-melting metal paste is not limited to this, and, for example, Sn to which one or more of Bi, Pb, Zn, and Ag are added may be employed.

Further, in the above-described embodiments, the via hole is 100 μm in diameter. Alternatively, a via hole of, for example, 50 μm in diameter may be formed by a laser drill. In this case, it is preferable that the metal particles with which the via hole is filled have an average particle size of 5 μm.

Further, the film thickness of the Au coat provided on the metal particles may also be suitably selected from the range of 0.03 μm to 0.1 μm.

In a preferred embodiment of the present invention, a via hole for connecting interconnection layers is filled with metal particles of good conductivity (such as Cu) having a Au or Ag film formed on the surfaces thereof, and the metal particles are brought into contact with a film of low-melting metal (such as Sn) formed on a land at the time of stacking the interconnection layers so as to cause the low-melting metal to diffuse onto the surfaces of the metal particles, thereby connecting the interconnection layers. As the low-melting metal, Sn—Bi—Ag-based solder and the like may be employed.

Specifically, according to one aspect of the present invention, there is provided a multilayer interconnection substrate including a multilayer interconnection layer having at least a first interconnection layer and a second interconnection layer stacked with an insulating layer provided therebetween; and a connection via configured to electrically connect the first interconnection layer and the second interconnection layer, wherein the connection via includes an internal conductor and a metal film covering the internal conductor, the internal conductor being an aggregate of metal particles.

In a preferred embodiment of the present invention, the melting point of the metal film may be lower than the melting point of the metal particles. For example, the metal particles may be copper (Cu) or a copper alloy, and the metal film includes tin (Sn) or a tin alloy as a principal component.

According to another aspect of the present invention, there is provided a method of manufacturing a multilayer interconnection substrate including the steps of (a) forming an interconnection pattern on a first insulating layer; (b) forming a film of low-melting metal on a land part of the interconnection pattern, the land part being to be connected to a via; (c) forming a via hole in a second insulating layer and filling the via hole with metal particles; and (d) connecting the interconnection pattern to the via hole by causing the low-melting metal to diffuse onto surfaces of the metal particles in the via hole by bringing the film of the low-melting metal and the metal particles in the via hole into contact with each other by superposing the first insulating layer and the second insulating layer.

According to the above-described configuration and method, there are no restrictions on lines and space width. Further, since the particles in a via are joined through diffusion of low-melting metal, the particles are in point contact with one another, so that low-resistance joining can be achieved.

Further, since the low-melting metal diffuses onto the surfaces of the metal particles in the via so as to enter the spaces among the metal particles, the anchor effect is produced, so that connection reliability can be improved.

The present invention is not limited to the specifically disclosed embodiments, and variations and modifications may be made without departing from the scope of the present invention.

What is claimed is:

1. A multilayer interconnection substrate, comprising:
a multilayer interconnection layer including at least a first interconnection layer and a second interconnection layer stacked with an insulating layer provided therebetween; and
a connection via in contact with a first land on the first interconnection layer and a second land on the second interconnection layer to electrically connect the first interconnection layer and the second interconnection layer,
wherein the connection via includes an internal conductor and a metal film covering the internal conductor, the internal conductor being an aggregate of metal particles, the metal particles consisting of copper (Cu),
the metal film is a diffused layer on surfaces of the metal particles, joining and coating each of the metal particles,
the metal film joining and coating each of the metal particles has a first area and a second area interfacing with the first land and the second land, respectively, and the first area and the second area are substantially equal in area to the first land and the second land, respectively, and
gold (Au) is diffused in the metal film.

2. The multilayer interconnection substrate as claimed in claim 1, wherein a melting point of the metal film is lower than a melting point of the metal particles.

3. The multilayer interconnection substrate as claimed in claim 1, wherein:
the metal film includes one of tin (Sn) and a tin alloy as a principal component.

4. The multilayer interconnection substrate as claimed in claim 3, wherein the metal film includes the tin alloy as the principal component, and the tin alloy included in the metal film has at least one type of metal element added to tin, the at least one type of metal element being selected from the group consisting of Bi, Pb, Zn, and Ag.

5. The multilayer interconnection substrate as claimed in claim 1, wherein the metal particles are 5 μm to 15 μm in diameter.

6. The multilayer interconnection substrate as claimed in claim 1, wherein the insulating layer is a resin insulating layer.

7. The multilayer interconnection substrate as claimed in claim 1, wherein a part of the surfaces of the metal particles forms an alloy with a metal of the metal film.

* * * * *